(12) United States Patent
Venugopal et al.

(10) Patent No.: US 8,319,561 B2
(45) Date of Patent: Nov. 27, 2012

(54) AMPLIFIERS WITH DEPLETION AND ENHANCEMENT MODE THIN FILM TRANSISTORS AND RELATED METHODS

(75) Inventors: Sameer M. Venugopal, San Jose, CA (US); Aritra Dey, Folsom, CA (US); David R. Allee, Phoenix, AZ (US)

(73) Assignee: Arizona Board of Regents, a body corporate of the State of Arizona, Acting for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 13/411,356

(22) Filed: Mar. 2, 2012

(65) Prior Publication Data

US 2012/0206207 A1 Aug. 16, 2012

Related U.S. Application Data

(63) Continuation of application No. PCT/US2010/047336, filed on Aug. 31, 2010.

(60) Provisional application No. 61/239,266, filed on Sep. 2, 2009.

(51) Int. Cl.
*H03F 3/14* (2006.01)
*H01L 27/148* (2006.01)
*G09G 3/36* (2006.01)

(52) U.S. Cl. .................. 330/307; 257/215; 365/185.14; 345/100

(58) Field of Classification Search ................. 330/307; 257/215; 365/185.14; 345/100
See application file for complete search history.

(56) References Cited

U.S. PATENT DOCUMENTS

| | | | | |
|---|---|---|---|---|
| 5,726,589 | A * | 3/1998 | Cahill et al. | 326/81 |
| 5,969,569 | A * | 10/1999 | Marceau et al. | 327/574 |
| 6,351,160 | B1 * | 2/2002 | Chan et al. | 327/108 |
| 6,567,066 | B1 | 5/2003 | Hashimoto | |
| 6,911,858 | B2 * | 6/2005 | Mori | 327/307 |
| 7,317,441 | B2 * | 1/2008 | Tobita | 345/100 |
| 2002/0012271 | A1 | 1/2002 | Forbes | |
| 2003/0128575 | A1 | 7/2003 | Chen | |
| 2008/0157128 | A1 | 7/2008 | Katz et al. | |
| 2009/0187868 | A1 * | 7/2009 | Jain et al. | 716/6 |
| 2009/0315877 | A1 * | 12/2009 | Deane | 345/214 |

* cited by examiner

*Primary Examiner* — Patricia Nguyen
(74) *Attorney, Agent, or Firm* — Bryan Cave LLP

(57) ABSTRACT

Embodiments of amplifiers with depletion and enhancement mode thin film transistors are disclosed herein. Other examples, devices, and related methods are also disclosed herein.

28 Claims, 5 Drawing Sheets

*TRANSISTOR 1200 Model : ENHANCEMENT MODE
.model FTFTEn nmos level=8 tnom=27 vth=1.25 tox=1.2e-07
+xj=2e-07 nch=3e+17 vsat=1000 k1=0 dvt1=0.45 cdscd=1 rdsw=2000000
+mobmod=2 u0=6.15e-05 ua=0 ub=0 nfactor=0 nqsmod=1 elm=1
+voff=-0.3 cit=0.0015 eta0=30 dsub=0.3 delta=0.7 ags=0 pscbe1=1 pscbe2=1.e-7
+uc=0 dvt0=0.0 dvt2=0 keta=0 etab=0 js=0.0 jsw=0.0 cgso=1.0e-9 cgdo=1.0e-9
*bgidl d s i=u(v(s,g)) * 1e-19 * (exp(v(d,g)/(80*26e-3)) - 1.0)
*btunl d s i=u(v(s,g)+1.25) * 2.7e-12 * exp(v(d,s)/4) * exp(v(g,s)/1-1)

*TRANSISTOR 1100 Model : DEPLETION MODE
.model FTFTDep nmos level=8 tnom=27 vth=-3.25 tox=1.2e-07
+xj=2e-07 nch=3e+17 vsat=1000 k1=0 dvt1=0.45 cdscd=1 rdsw=2000000
+mobmod=2 u0=6.15e-05 ua=0 ub=0 nfactor=0 nqsmod=1 elm=1
+voff=-0.3 cit=0.0015 eta0=30 dsub=0.3 delta=0.7 ags=0 pscbe1=1 pscbe2=1.e-7
+uc=0 dvt0=0.0 dvt2=0 keta=0 etab=0 js=0.0 jsw=0.0 cgso=1.0e-9 cgdo=1.0e-9
*bgidl d s i=u(v(s,g)) * 1e-19 * (exp(v(d,g)/(80*26e-3)) - 1.0)
*btunl d s i=u(v(s,g)+1.25) * 2.7e-12 * exp(v(d,s)/4) * exp(v(g,s)/1-1)

AMPLIFIERS WITH DEPLETION AND ENHANCEMENT MODE THIN FILM TRANSISTORS AND RELATED METHODS

CROSS REFERENCE TO RELATED APPLICATION

This patent application is a continuation of International PCT Patent Application No. PCT/US2010/047336, filed on Aug. 31, 2010, which claims priority to U.S. Provisional Patent Application No. 61/239,266, filed on Sep. 2, 2009. The contents of the applications listed above is incorporated herein by reference.

STATEMENT REGARDING FEDERAL SPONSORSHIP

At least part of the disclosure herein was funded with government support under grant number W911NF-04-2-0005, awarded by the Army Research Laboratory. The United States Government may have certain rights in this invention.

TECHNICAL FIELD

This invention relates generally to semiconductor devices, and relates, more particularly, to amplifiers with depletion and enhancement mode thin film transistors and related methods.

BACKGROUND

The development of thin film transistor technology has been beneficial for several applications, such as for the manufacture of integrated display circuits. In some cases, to streamline manufacturing processes, semiconductor process flows may be limited to yield only specific types of transitors. For example, one semiconductor process flow may be streamlined to yield integrated circuits having only N-type enhancement mode transistors, such as for the manufacture of displays like active matrix thin film transistor displays. As a result, such integrated circuits would normally use external amplifiers, or integrated amplifiers that use only the type of transistor generated by the streamlined semiconductor process flow. The use of external amplifiers can add cost and complexity to the development and/or production process. In addition, being restricted to a single type of transistor for the integrated amplifiers can limit the performance of such integrated circuits.

Therefore, a need exists to develop integrated amplifiers and related methods with transistors having selectively alterable characteristics to overcome or mitigate the limitations described above.

BRIEF DESCRIPTION OF THE DRAWINGS

To facilitate further description of the embodiments, the following drawings are provided in which:

FIG. 2 illustrates sample models of first and second transistors for the amplifier of FIG. 1.

Figure 1:
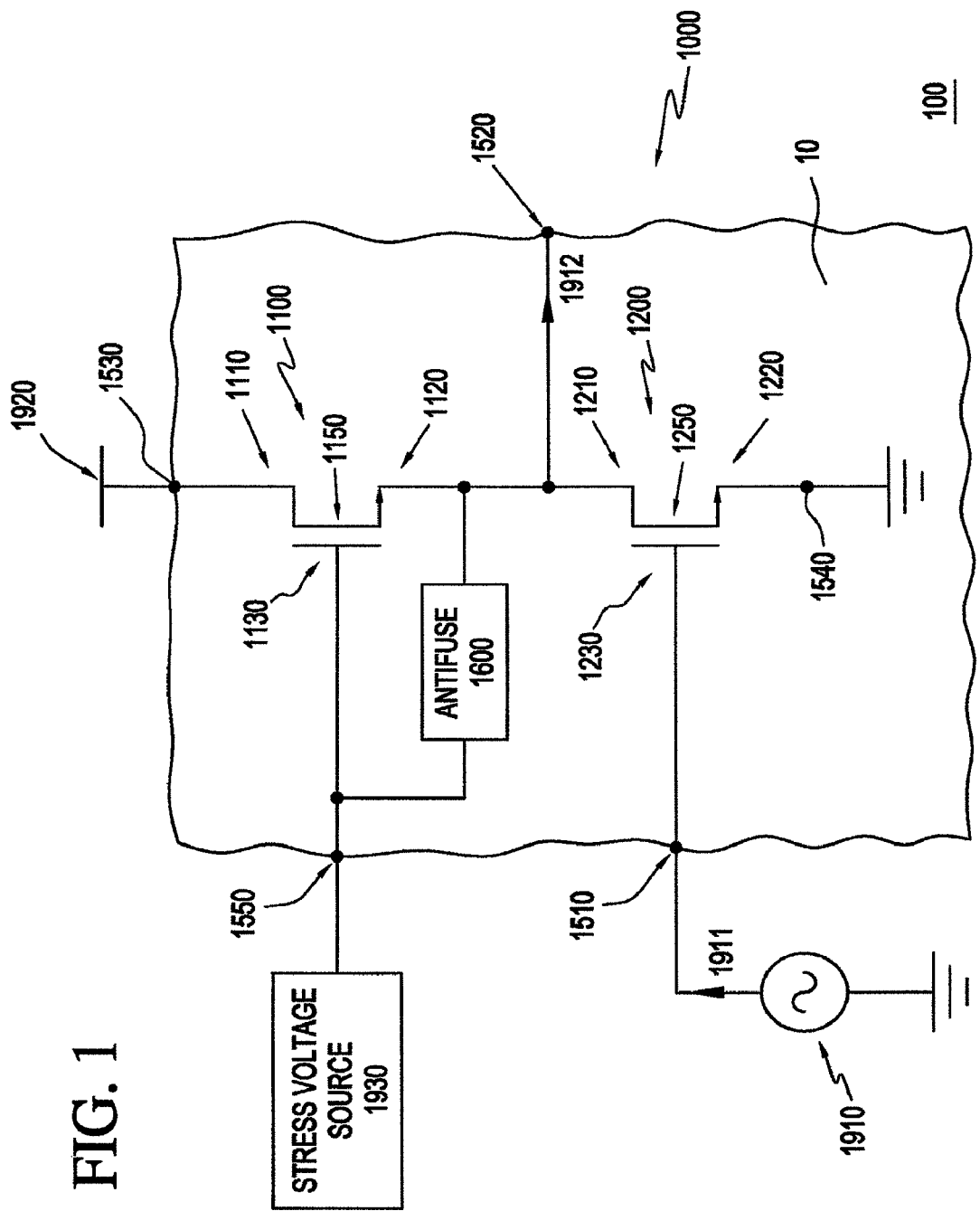
FIG. 1 illustrates a schematic of an integrated circuit comprising an amplifier in accordance with one embodiment of the present disclosure.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled together but not be mechanically or otherwise coupled together; two or more mechanical elements may be mechanically coupled together, but not be electrically or otherwise coupled together; two or more electrical elements may be mechanically coupled together, but not be electrically or otherwise coupled together. Coupling may be for any length of time, e.g., permanent or semi-permanent or only for an instant.

An electrical "coupling" and the like should be broadly understood and include coupling involving any electrical signal, whether a power signal, a data signal, and/or other types or combinations of electrical signals. A mechanical "coupling" and the like should be broadly understood and include mechanical coupling of all types. The absence of the word "removably," "removable," and the like near the word "coupled," and the like does not mean that the coupling, etc. in question is or is not removable.

DESCRIPTION

In one embodiment, an apparatus comprises an integrated circuit comprising an amplifier. The amplifier can comprise a first transistor over a substrate of the integrated circuit, and a second transistor over the substrate and coupled to the first transistor. The first transistor can comprise a first source terminal, a first drain terminal, and a first gate terminal. The second transistor can comprise a second source terminal, a second drain terminal, and a second gate terminal. An input node of the amplifier can be coupled to the second transistor, such as to the second gate terminal. An output node of the amplifier can be coupled between the first and second transistors, such as by coupling the second drain terminal and the first source terminal together at the output node. In the same or other embodiments, the first and second transistors comprise thin film transistors, and the substrate comprises a flexible substrate. The first transistor comprises a threshold voltage alterable from an initial threshold voltage value to a target threshold voltage value, and the first gate terminal the first source terminal are configured to be selectively coupled together.

Referring to the figures, FIG. 1 illustrates a schematic of integrated circuit 100 comprising amplifier 1000 in accordance with one embodiment of the present disclosure. Amplifier 1000 comprises transistor 1100 having control terminal 1130 configured to control channel 1150 between terminals 1110 and 1120 of transistor 1100. Amplifier 1000 also comprises transistor 1200 having control terminal 1230 configured to control channel 1250 between terminals 1210 and 1220 of transistor 1200. Input node 1510 of amplifier 1000 is coupled to transistor 1200, while output node 1520 of amplifier 1000 is coupled between transistors 1100 and 1200. FIG. 1 also shows source 1910 coupled to input node 1510, where source 1910 can be used to provide input signal 1911, which is amplified by amplifier 1000, and to output the signal as output signal 1912 via output node 1520. Source 1910 comprises a sinusoidal voltage source in the present example, although in other examples the voltage source need not be sinusoidal. In the present example, terminals 1110, 1120, and 1130 comprise drain, source, and gate terminals, respectively, of transistor 1100. Similarly, terminals 1210, 1220, and 1230 comprise drain, source, and gate terminals, respectively, of transistor 1200.

Transistors 1100 and 1200 comprise thin film transistors (TFTs), and are both located over substrate 10. Accordingly, at least transistor 1100 comprises a threshold voltage that is alterable from an initial threshold voltage value to a target threshold voltage value. As will be described below, the threshold voltage of transistor 1100 can be altered by electrically stressing channel 1150 via control terminal 1130. In some examples, portions of transistor 1100, such as channel 1150, can comprise an amorphous material, such as amorphous silicon, a metal oxide material, such as zinc oxide, a mixed oxide material, such as Indium/Gallium/Zinc Oxide (IGZO), a nanocrystalline material, such as nanocrystalline silicon, and/or an organic material, such as pentacene. In the present example, substrate 10 comprises a flexible substrate, and both of transistors 1100 and 1200 are fabricated simultaneously over substrate 10 via a common semiconductor process flow. Transistor 1200 can also comprise a similarly alterable threshold voltage.

In the same or other examples, substrate 10 can be a plastic substrate, and/or can comprise at least one of a flexible polyethylene naphthalate (PEN) material, such as that available from Teijin DuPont Films of Tokyo, Japan, under the tradename planarized "Teonex® Q65," a polyethylene terephthalate (PET) material, a polyethersulfone (PES) material, a polyimide, a polycarbonate, a cyclic olefin copolymer, and/or a liquid crystal polymer. In other examples, substrate 110 can comprise other materials such as a stainless steel material, a silicon material, an iron nickel (FeNi) alloy material (e.g., FeNi, FeNi36, or Inver™; where Inver™ comprises an alloy of iron (64 percent (%)) and nickel (36%) (by weight) with some carbon and chromium), an iron nickel cobalt (FeNiCo) alloy material (e.g., Kovar™, where Kovar™ typically comprises 29% nickel, 17% cobalt, 0.2% silicon, 0.3% manganese, and 53.5% iron (by weight)), a titanium material, a tantalum material, a molybdenum material, an aluchrome material, and/or an aluminum material. In another embodiment, substrate 10 can be rigid and can comprise a semiconductor material such as silicon.

The present example of FIG. 1 further describes the interconnection between transistors 1100 and 1200 of amplifier 1000. For example, terminals 1120 and 1210 couple transistors 1100 and 1200 together at output node 1520. In addition, input node 1510 is coupled to transistor 1200 at terminal 1230. Terminal 1110 is coupled to path 1530 to voltage source 1920 of integrated circuit 100. Terminal 1220 of transistor 1200 is coupled to ground via node 1540. In some embodiments, the coupling to ground couples terminal 1220 to substrate 10. The present example also shows control terminal 1130 and terminal 1120 of transistor 1100 selectively coupled together via antifuse 1600. In one embodiment, amplifier 1000 comprises a common source amplifier with depletion load when antifuse 1600 couples or otherwise shorts terminals 1130 and 1120 together.

Because of its structure as part of a TFT transistor, channel 1150 of transistor 1100 can be subject to electrical stress degradation that can alter its conducting characteristics. In the example of FIG. 1, stress voltage source 1930 is coupled to control terminal 1130 of transistor 1100 via a path through node 1550, where stress voltage source 1930 is configured to provide a stress voltage to alter the characteristics of channel 1150. For example, when the stress voltage is applied by stress voltage source 1930 to control terminal 1130, a relationship between conducting holes and electrons for underlying channel 1150 can be permanently changed. As a result, the threshold voltage of transistor 1100 can be altered from the initial threshold voltage value to the target threshold voltage value, and can remain altered at the target threshold voltage value even after the stress voltage is no longer applied. In some examples, the alteration of the threshold voltage can be due to charge injection into a gate insulator of transistor 1100, and/or due to a creation of defect states in channel 1150.

In some examples, the initial threshold voltage value for transistor 1100 can be of approximately 1 volt to approximately 3 volts, and/or the target threshold voltage can be of approximately −1 volt to approximately −3 volts. In the same or other examples, the stress voltage applied to control terminal 1130 can comprise approximately −10 volts to approximately −20 volts, and/or the stress voltage can be applied to control terminal 1130 from approximately 100 seconds to approximately 200 seconds. The quantities above may be scaled or otherwise modified depending on the type or size of transistor 1100 and/or 1200, or depending on other ranges of initial and target threshold voltage values.

In the present example illustrated in FIG. 1, channels 1150 and 1250 of transistors 1100 and 1200, respectively, are both N-type channels. Transistor 1100 also comprises an initial operating mode before alteration of its threshold voltage as described above, and a target operating mode achieved after alteration of its threshold voltage to the target threshold voltage value. In the present example, the initial operating mode for transistor 1100 comprises an enhancement mode, and the target operating mode comprises a depletion mode. For its part, transistor 1200 also comprises an operating mode that matches the initial operating mode of transistor 1100, and that remains unchanged when the threshold voltage of transistor 1100 is altered.

Because the channel types and initial operating modes of transistors 1110 and 1120 match each other, amplifier 1000 is suitable for inclusion as part of integrated circuits based on a process flow that yields transistors of a single channel type and/or of a single operating mode. For example, where integrated circuit 100 comprises integrated display circuitry built on substrate 10 with a process flow configured to yield only N-type enhancement mode transistors, amplifier 1000 could be added as part of the integrated display circuit without having to alter the process flow. The target operating mode of transistor 1100 could then be altered to the depletion mode, thus allowing the flexibility to configure amplifier 1000 as an N-type common source amplifier with N-type depletion load while still using a process flow configured to yield only enhancement mode transistors. The configuration described for amplifier 1000 can also be beneficial over other configurations that rely on P-type load devices, because the mobilities of the N-type channels are greater than those of P-type channels.

Figure 5:
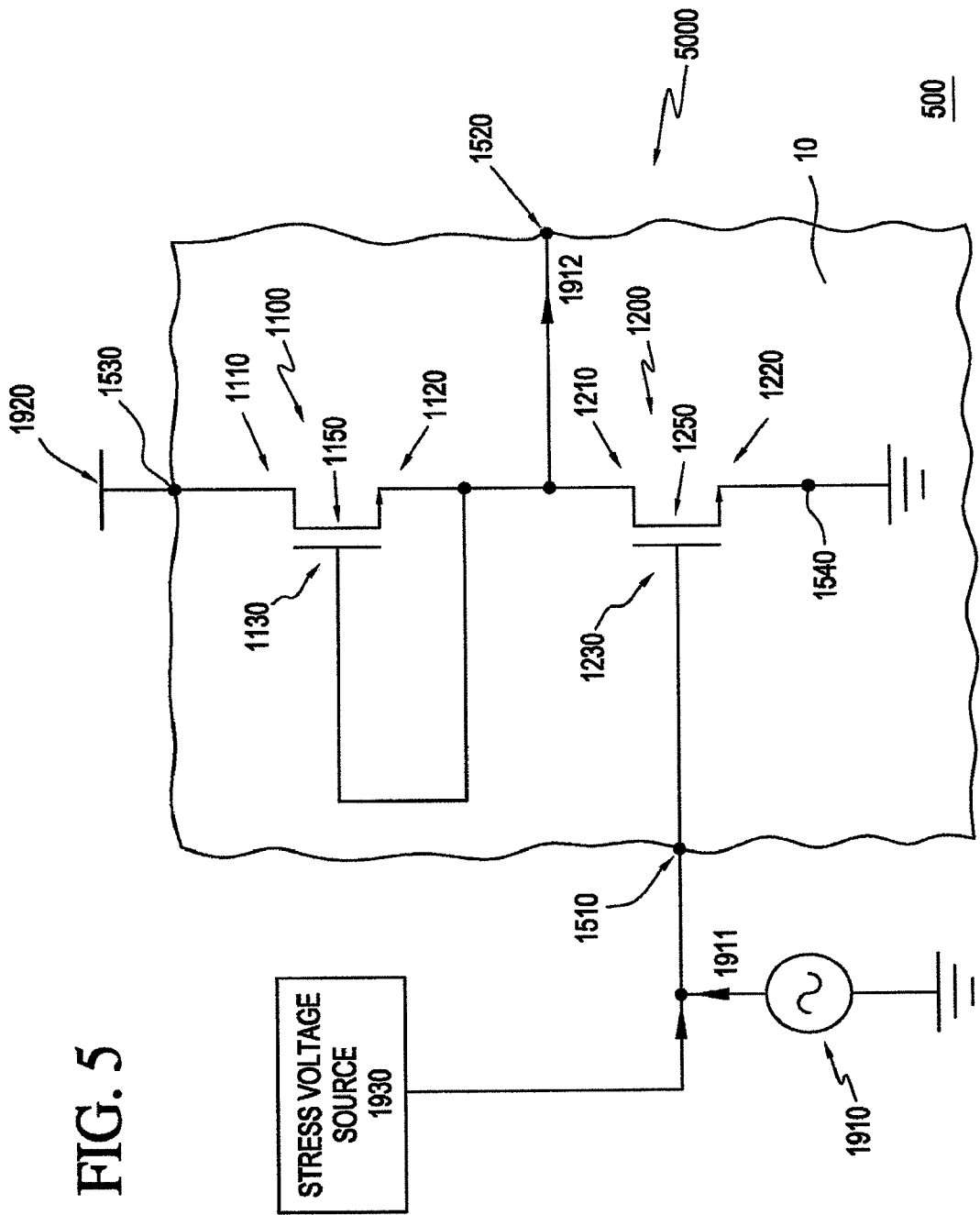
FIG. 5 illustrates a schematic of another integrated circuit comprising another amplifier in accordance with another embodiment of the present disclosure.

Although in the present example the operating mode of transistor 1200 and the initial operating mode of transistor 1100 both comprise the enhancement mode, there can be other embodiments where both transistors 1100 and 1200 comprise the depletion mode in their initial operating mode. One such embodiment is illustrated in FIG. 5 for integrated circuit 500 with amplifier 5000, where integrated circuit 500 is a different embodiment of, yet similar to, integrated circuit 100 of FIG. 1. In FIG. 5, stress voltage source 1930 is coupled to control terminal 1230 of transistor 1200, rather than to control terminal 1130 of transistor 1100. As a result, stress voltage source 1930 can be configured to provide a stress voltage to alter the characteristics of channel 1250 of transistor 1200, and thereby convert transistor 1200 to a target operating mode comprising the enhancement mode. In the embodiment of FIG. 5, the stress voltage supplied by stress voltage source 1930 could comprise a positive voltage value. In addition, Antifuse 1600 may not be needed in embodiments where the initial operating mode of transistors 1100 and 1200 comprises the depletion mode. As a result, integrated circuit 500 in FIG. 5 dispenses with antifuse 1600, and terminals 1120 and 1130 are directly shorted together therein. Regardless of whether the threshold voltage of transistor 1100 or of transistor 1200 is altered or not in one or more of the embodiments described herein, the channel type of channels 1150 and/or 1250 can remain unchanged.

Returning to FIG. 1, and with respect to similar embodiments, transistor 1100 can be configured to serve as a load device for amplifier 1000. In the same or other embodiments, amplifier 1000 can comprise a constant current source comprising transistor 1100, such that a current output of the constant current source can be tuned or adjusted by altering the threshold voltage of transistor 1100 towards the target threshold voltage value. In the same or other embodiments, the target threshold voltage value for transistor 1100 can be established based on a target current output for the constant current source.

In the present example, the ability to alter the threshold voltage of transistor 1100 and thereby establish the depletion mode as the target operating mode for transistor 1100 can permit configuration of elements of integrated circuit 100, such as amplifier 1000, even after fabrication of integrated circuit 100. In the present example, amplifier 1000 can be configured to comprise transistor 1100 as a depletion load transistor, even if the semiconductor process flow used to manufacture amplifier 1000 over substrate 10 only yields transistors of a single channel type and/or of a single initial operating mode. In the present example, such flexibility permits the use of transistor 1100 as a depletion load device, thereby affording greater gains for amplifier 1000 than a similar amplifier limited to using an enhancement-type load device.

Antifuse 1600 can be used in some examples to establish of the target operating mode for transistor 1100 by isolating control terminal 1130 from the rest of amplifier 1000 until after the threshold voltage of transistor 1100 has been altered. Antifuse 1600 can thus be actuatable to selectively couple together terminals 1130 and 1120 of transistor 1100. In the present example, an impedance of antifuse 1600 is alterable from an initial high impedance value to a target low impedance value when antifuse 1600 is actuated. As a result, antifuse 1600 can short terminals 1130 and 1120 together, normally after application of the stress voltage to terminal 1130. In some examples, antifuse 1600 can comprise an antifuse reactive layer coupled between two antifuse conductors, where the antifuse reactive layer comprises a material that is initially non-conductive but that becomes conductive when activated. In the same or other examples, antifuse 1600 can be actuated by sourcing a current through the antifuse reactive layer to thereby short the two antifuse conductors. In the same or other examples, the shorting of the two antifuse conductors can be permanent once accomplished. There can be examples where the antifuse reactive layer can comprise one or more of a metal oxide layer, a tantalum oxide layer, or an amorphous silicon layer. In the same or other examples, the antifuse conductors can comprise a metallic material, such as a tantalum material, an aluminum material, and/or a molybdenum material.

In some examples, the configuration of amplifier 1100 as a common source amplifier with depletion load after the actuation of antifuse 1600 can be beneficial to prevent or limit the degradation in performance of amplifier 1100 over time. Where amplifiers rely on TFTs as load devices, channel degradation due to gate to source bias of the load device can tend to diminish the performance of such amplifiers, yielding lower gains at their output nodes. In examples that use an enhancement mode TFT as the load device, where the gate and drain of the load device are shorted together, the gate to source bias is unchecked and can eventually degrade the performance of such enhancement load TFT. In the example of FIG. 1, however, if control terminal 1130 acts as the gate terminal for transistor 1100, and if terminal 1120 acts as the source terminal for transistor 1100, then transistor 1100 acts as a depletion mode load device for amplifier 1100 when terminals 1130 and 1120 are coupled or otherwise shorted together by antifuse 1600 and when transistor 1100 operates in its target operating mode. Because the gate and source terminals for transistor 1100 would then be effectively shorted together, the gate to source bias can be thereby limited or neutralized, such that the degradation of transistor 1100 as a load device for amplifier 1000 can also be thereby limited and/or prevented.

Substrate can also support a display, such as a TFT display, and in this embodiment, integrated circuit 100 also includes the TFT display. In some embodiments, antifuse 1600 is also located over substrate 10. Substrate 10 can also optionally support source 1910 and/or stress voltage source 1930.

Figure 3:
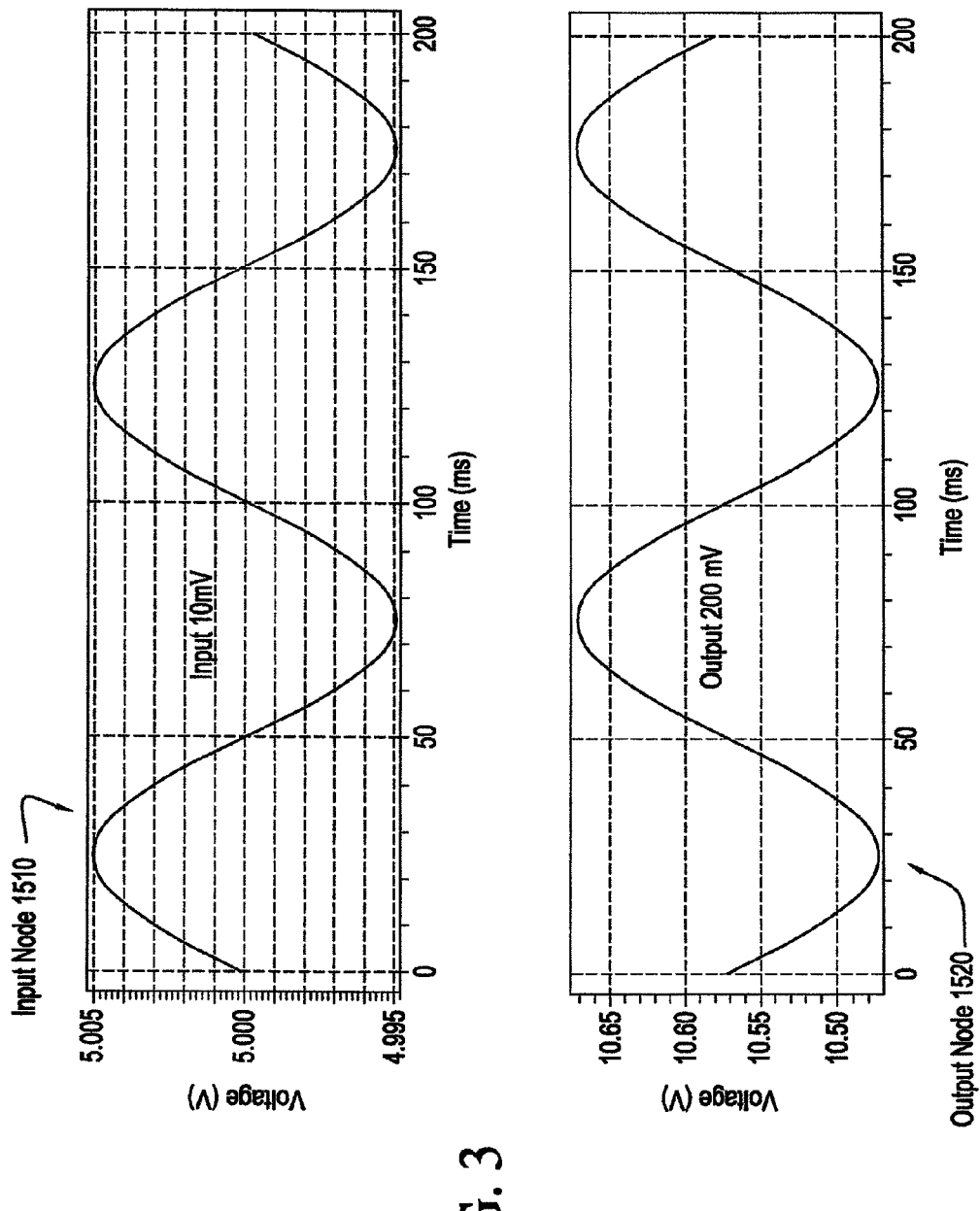
FIG. 3 illustrates sample waveforms for input and output signals processed by the amplifier of FIG. 1 based on the sample models of FIG. 2.

Continuing with the figures, FIG. 2 illustrates sample models for transistors 1100 and 1200 of amplifier 1000 for the example of FIG. 1. As can be seen in FIG. 2, the models for transistors 1100 and 1200 differ only in their respective threshold voltages. Transistor 1100 has already been altered to the depletion mode as the target operating mode, and is configured to turn off at the threshold voltage of −3.25 volts. Transistor 1200 remains in its initial operating mode as an enhancement mode transistor, configured to turn on at the threshold voltage of 1.25 volts. In its initial operating mode, transistor 1100 has the same model characteristics as shown for transistor 1200 in FIG. 2. FIG. 3 illustrates sample waveforms for input signal 1911 and output signal 1912 for amplifier 1000 of FIG. 1 based on the models of FIG. 2. As can be seen from the waveforms in FIG. 3, amplifier 1000 can provide a gain of about 20 volts per volt for input signal 1911 using the models described in FIG. 2. Such high gain is possible in the present embodiment as a result of the depletion load configuration for transistor 1100 in FIG. 1.

Figure 4:
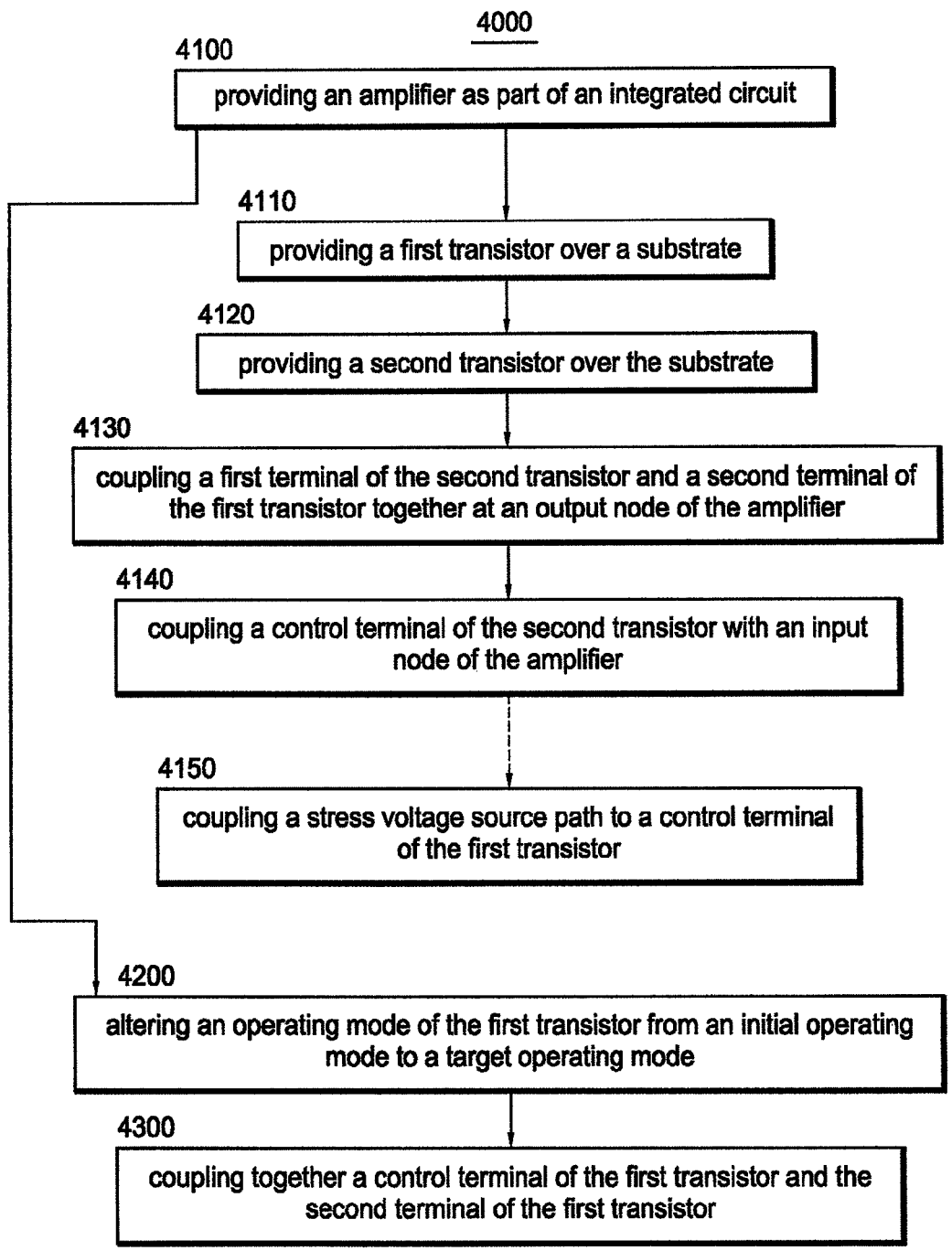
FIG. 4 illustrates a flowchart of a method for providing an integrated circuit comprising an amplifier.

Moving on, FIG. 4 illustrates a flowchart of a method 4000 for providing an integrated circuit. In some examples, the integrated circuit can be similar to integrated circuit 100, at least a part of which is shown in FIG. 1. Method 4000 comprises block 4100 for providing an amplifier as part of the integrated circuit, where the amplifier for block 4100 can be similar to amplifier 1000 as described above with respect to FIGS. 1-3. There can be examples where block 4100 of method 4000 can comprise several sub-blocks, as described below.

In the present example, block 4100 of method 4000 comprises sub-block 4110 and 4120, where sub-block 4110 comprises providing a first transistor over a substrate, and sub-block 4120 comprises providing a second transistor over the substrate of sub-block 4110. In some examples, the first transistor can be similar to transistor 1100 (FIGS. 1-2), comprising a first terminal similar to terminal 1110 (FIG. 1), a second terminal similar to terminal 1120 (FIG. 1), a control terminal similar to control terminal 1130 (FIG. 1), and a channel between the first and second terminals, similar to channel 1150 (FIG. 1). In the same or other examples, the second transistor of block 4120 can be similar to transistor 1200 (FIGS. 1-2), comprising a first terminal similar to terminal 1210 (FIG. 1), a second terminal similar to terminal 1220 (FIG. 1), a control terminal similar to control terminal 1230 (FIG. 1), and a channel between the first and second terminals, similar to channel 1250 (FIG. 1). The first and second transistors can comprise thin film transistors in some embodiments, as described above for transistor 1100 and 1200. In addition, the substrate over which the first and second transistors of block 4100 are located can be similar to substrate 10, as described above for FIG. 1. As an example, the substrate can comprise a flexible substrate and/or material.

In some examples, providing the second transistor in block 4120 can comprise providing a channel type of the second transistor as one of an N-type channel or a P-type channel, and can also comprise providing the initial operating mode of the second transistor as one of the enhancement mode or the depletion mode. In such examples, providing the first transistor in block 4110 can comprise providing a channel type of the first transistor to match the channel type of the second transistor, and can also comprise providing the initial operating mode of the first transistor to match the initial operating mode of the second transistor. Amplifier 1000 of FIG. 1 can be an example of the above, where both channels 1150 and 1250 of transistors 1100 and 1200, respectively, comprise N-type channels, and where the initial operating mode of both transistors 1100 and 1200 is the enhancement mode.

Block 4100 of method 4000 can also comprise in some examples sub-block 4130, comprising coupling the first terminal of the second transistor and the second terminal of the first transistor together at an output node of the amplifier of block 4100. In some examples, the coupling in block 4100 can be configured as illustrated in FIG. 1, where terminals 1120 and 1220 of transistors 1100 and 1200, respectively, are coupled together at output node 1520 of amplifier 1000.

In the same or other examples, block 4100 can comprise in some examples sub-block 4140 for coupling the control terminal of the second transistor with an input node of the amplifier of block 4100. The coupling in block 4140 can be configured as illustrated in FIG. 1 in some examples, where control terminal 1230 of transistor 1200 is coupled with input node 1510 over substrate 10.

Block 4100 can in some examples comprise sub-block 4150 for coupling a stress voltage source path to the control terminal of the first transistor. In some examples, the stress voltage source path can be similar to the path through node 1550 between stress voltage source 1930 and control terminal 1130 of transistor 1100 (FIG. 1).

Method 4000 can further comprise block 4200 for altering an operating mode of the first transistor from an initial operating mode to a target operating mode. In the same or other examples, altering the operating mode of the first transistor in block 4200 can comprise altering a threshold voltage of the first transistor from an initial threshold voltage value to a target threshold voltage value. There can be examples where the threshold voltage of the first transistor can be altered as described above with respect to the threshold voltage for transistor 1100, such as by applying a stress voltage to the control terminal of the first transistor of sub-block 4110. The alteration of the operating mode of the first transistor can also be achieved as described above with respect to altering the operating mode of transistor 1100.

In one embodiment of block 4200, the channel of the first transistor can comprise an N-type channel, where the initial operating mode of the first transistor comprises the enhancement mode, and/or where the initial threshold voltage value of the first transistor comprises a positive voltage value. In such an embodiment, the stress voltage could be applied as a negative voltage to the control terminal of the first transistor to establish the target threshold voltage of the first transistor as a negative voltage and/or to thereby establish the target operating mode for the first transistor as the depletion mode. In the same or other embodiments, providing the first transistor in sub-block 4110 could comprise configuring the threshold voltage of the first transistor to remain altered after the stress voltage has been applied to the control terminal of the first transistor. This result can be achieved, in some examples, due to the characteristics of materials used to form the first transistor, as described above with respect to transistor 1100. In many embodiments, the initial operating mode of the second transistor is maintained when block 4200 is implemented. In addition, the channel types of the first and/or second transistors can also be maintained when block 4200 is implemented.

The alteration of the threshold voltage in block 4200 can be achieved by applying the stress voltage to the control terminal of transistor 1100 either iteratively or continuously. For example, the stress voltage from stress voltage source 1930 could be applied to control terminal 1130 of transistor 1100 (FIG. 1) continuously for a predetermined amount of time calculated to bring the threshold voltage proximate to the target threshold voltage value. In other embodiments, the stress voltage could be applied iteratively instead, where the threshold voltage of transistor 1100 is measured between iterations of the application of the stress voltage to determine when the target threshold voltage value is realized for transistor 1100. In the same or other embodiments, applying the stress voltage iteratively may result in a more consistent or precise target threshold voltage value. There can be embodiments where, after alteration of the threshold voltage of the first transistor in block 4200, the first transistor can serve as a constant current source for the amplifier of block 4100.

Method 4000 of FIG. 4 further comprises block 4300 for coupling together the control terminal of the first transistor and the second terminal of the first transistor. Block 4300 can be implemented in some examples as described for FIG. 1, where terminals 1130 and 1120 of transistor 1100 are coupled together, after the target operating mode for transistor 1100 has been altered to the depletion mode, to configure amplifier 1000 as a common source amplifier with depletion load.

There can be examples where block 4300 can comprise providing an antifuse mechanism which can be actuated to selectively couple the control terminal and the second terminal of the first transistor together, and providing an antifuse impedance of the antifuse mechanism to be alterable from a high impedance magnitude to a low impedance magnitude upon actuation of the antifuse mechanism. As an example, the antifuse mechanism can comprise antifuse 1600, as described above for FIG. 1 to couple terminals 1130 and 1120 of transistor 1100 together and thereby establish transistor 1100 as a depletion load for amplifier 1000. In the same or other examples, the antifuse mechanism can also be actuated as described above for antifuse 1500.

There can be examples where the integrated circuit of method 4000 can be field programmable as part of a programmable logic device. For example, the integrated circuit may comprise one or more amplifiers similar to amplifier 1000 (FIG. 1), and individual ones of such one or more amplifiers can be enabled by the programmable logic device by altering the operating mode of their respective first transistors and by actuating their respective antifuse mechanisms.

In some examples, one or more of the different blocks of method 4000 can be combined into a single step. For example, blocks 4110 and 4120 in FIG. 4 can be combined into a single block where the first and second transistors are fabricated simultaneously. Similarly, blocks 4130 and 4140 can be combined, and block 4150 can be combined with blocks 4130 and/or 4140. In the same or a different example, the sequence of one or more of the different blocks of method 4000 can be changed. As an example, the sequence of blocks 4130 and 4140 be reversed if needed in some examples to write to the memory cell before reading the memory cell, and/or the sequence of blocks 4110 and 4120 can be reversed. In the same or a different example, method 4000 can comprise further or different steps.

Although the amplifiers with depletion and enhancement mode thin film transistors and related methods have been described herein with reference to specific embodiments, various changes may be made without departing from the spirit or scope of the disclosure. For example, although source 1910 has been represented in FIG. 1 as a sinusoidal source, there can be embodiments where source 1910 comprises a constant source. In addition, although nodes 1510, 1520, 1530, and 1550 have been represented in FIG. 1 at a periphery of substrate 10, in the same or other embodiments such nodes and other elements of integrated circuit 100, such as source 1910, stress voltage source 1930, and/or voltage source 1920, can be formed or located over substrate 10. Moreover, block 4100 of method 4000 can include providing a display, such as a TFT display, as part of the integrated circuit. Furthermore, the concepts described herein can be applied to analog circuits other than amplifiers. Additional examples of such changes have been given in the foregoing description. Accordingly, the disclosure of embodiments is intended to be illustrative of the scope of the invention and is not intended to be limiting. It is intended that the scope of this application shall be limited only to the extent required by the appended claims. The amplifiers with depletion and enhancement mode thin film transistors and related methods discussed herein may be implemented in a variety of embodiments, and the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method comprising:
providing an amplifier as part of an integrated circuit, comprising:
   providing a first transistor over a substrate, the first transistor comprising:
      a first terminal, a second terminal, and a control terminal to control a channel of the first transistor between the first and second terminals of the first transistor; and
   providing a second transistor over the substrate, the second transistor comprising:
      a first terminal, a second terminal, and a control terminal to control a channel of the second transistor between the first and second terminals of the second transistor;
   wherein one of the first transistor or the second transistor comprises a target transistor;
coupling the first terminal of the second transistor and the second terminal of the first transistor together at an output node of the amplifier;
altering a threshold voltage of the target transistor from an initial threshold voltage value to a target threshold voltage value; and
coupling together the control terminal of the first transistor and the second terminal of the first transistor.

2. The method of claim 1, wherein:
the substrate comprises a flexible substrate; and
the first transistor comprises a thin film transistor.

3. The method of claim 1, wherein:
providing the amplifier comprises:
   configuring the threshold voltage of the target transistor to remain at the target threshold value after a stress voltage is applied to the control terminal of the target transistor.

4. The method of claim 3, wherein:
altering the threshold voltage of the target transistor comprises:
   applying the stress voltage iteratively until the target threshold voltage value is reached; and
   measuring the threshold voltage between iterations of the stress voltage.

5. The method of claim 1, wherein:
providing the amplifier as part of the integrated circuit further comprises:
  coupling a stress voltage source path to the control terminal of the target transistor; and
  coupling the second terminal of the second transistor to a ground.

6. The method of claim 1, wherein:
altering the threshold voltage of the target transistor comprises:
  providing the first transistor as a current source for the amplifier after altering the threshold voltage of the target transistor to the target threshold voltage value; and
coupling together the control terminal of the first transistor and the second terminal of the first transistor occurs after altering the threshold voltage of the target transistor.

7. The method of claim 1, wherein:
coupling the control terminal of the first transistor and the second terminal of the first transistor together comprises:
  providing an antifuse mechanism actuatable to selectively couple the control and second terminals of the first transistor together; and
  providing an antifuse impedance of the antifuse mechanism to be alterable from a high impedance magnitude to a low impedance magnitude upon actuation of the antifuse mechanism.

8. The method of claim 7, wherein:
providing the antifuse mechanism comprises:
  providing an antifuse reactive layer coupled between first and second conductors;
wherein the antifuse reactive layer comprises at least one of:
  an oxide layer;
  a metal oxide layer; or
  an amorphous silicon layer.

9. The method of claim 1, wherein:
the channel of the target transistor comprises an n-type channel;
an initial operating mode of the target transistor comprises an enhancement mode; and
a target operating mode of the target transistor comprises a depletion mode.

10. The method of claim 1, wherein:
providing the amplifier comprises:
  providing the second transistor to comprise:
    a channel type comprising one of an n-channel type or a p-channel type; and
    an operating mode comprising one of a depletion mode or an enhancement mode; and
  providing the first transistor to comprise:
    the channel type of the second transistor; and
    an initial operating mode comprising the operating mode of the second transistor.

11. A method comprising:
providing an amplifier circuit comprising:
  a first transistor comprising a first source terminal, a first drain terminal, and a first gate terminal;
  a second transistor coupled to the first transistor and comprising a second source terminal, a second drain terminal, and a second gate terminal;
  an input node coupled to the second gate terminal; and
  an output node coupled to the first source terminal and the second drain terminal;
altering an operating mode of the first transistor from an initial operating mode to a target operating mode; and
electrically shorting the first gate terminal to the first source terminal;
wherein:
  the first and second transistors comprise thin film transistors;
  the initial operating mode for the first transistor comprises one of a depletion mode or an enhancement mode;
  the target operating mode for the first transistor comprises a different one of the depletion mode or the enhancement mode; and
  altering the operating mode of the first transistor comprises:
    applying a stress voltage to the first gate terminal.

12. The method of claim 11, wherein:
electrically shorting the first gate terminal to the first source terminal comprises:
limiting gate to source bias for the first transistor to thereby restrict degradation of an output at the output node of the amplifier circuit.

13. The method of claim 11, wherein:
electrically shorting the first gate terminal to the first source terminal comprises:
  actuating an antifuse between the first gate terminal and the first source terminal after altering the operating mode of the first transistor.

14. The method of claim 11, wherein:
the initial operating mode for the first transistor comprises the enhancement mode;
the target operating mode for the first transistor comprises the depletion mode;
the second transistor comprises an initial operating mode comprising the enhancement mode; and
altering the operating mode of the first transistor comprises:
  maintaining the initial operating mode of the second transistor.

15. The method of claim 11, wherein:
the first transistor comprises an n-channel type;
the second transistor comprises the n-channel type; and
altering the operating mode of the first transistor comprises:
  maintaining the n-channel type of the first and second transistors.

16. The method of claim 11, wherein:
providing the amplifier circuit comprises:
  providing the first and second transistors to comprise at least one of:
    a single channel type; or
    a single initial operating mode;
the single channel type comprises one of:
  an n-channel type; or
  a p-channel type;
and
the single initial operating mode comprises one of:
  the depletion mode; or
  the enhancement mode.

17. The method of claim 11, wherein:
providing the amplifier circuit comprises:
  providing the first and second transistors to comprise at least one of:
    a single channel type; or
    a single initial operating mode;
wherein:
  the single channel type comprises an n-channel type; and the single initial operating mode comprises the enhancement mode.

18. The method of claim 11, wherein:
the first and second transistors comprise n-type channels;
the initial operating mode of the first transistor is the enhancement mode;
an initial operating mode of the second transistor is the enhancement mode;
the target operating mode of the first transistor is the depletion mode;
the second transistor remains in the enhancement mode after the operating mode of the first transistor is altered;
applying the stress voltage to the first gate terminal comprises at least one of:
applying 10 volts to 20 volts to the first gate terminal; or
applying the stress voltage from 100 seconds to 200 seconds to the first gate terminal;
an initial threshold voltage value of the first transistor is of 1 volt to 3 volts;
after altering the operating mode of the first transistor, a target threshold voltage value of the first transistor is of 1 volt to 3 volts;
electrically shorting the first gate terminal to the first source terminal comprises:
providing a current through an antifuse between the first source terminal and the first gate terminal to alter a resistance of the antifuse from a high magnitude to a low magnitude; and
providing the amplifier circuit further comprises:
providing the amplifier circuit to be field programmable as part of a programmable logic device via actuation of the antifuse.

19. An apparatus comprising:
an integrated circuit comprising an amplifier, the amplifier comprising:
a first transistor over the integrated circuit, the first transistor comprising:
a first source terminal, a first drain terminal, and a first gate terminal;
a second transistor over the substrate and coupled to the first transistor, the second transistor comprising:
a second source terminal, a second drain terminal, and a second gate terminal;
an input node coupled to the second transistor; and
an output node coupled between the first and second transistors;
wherein:
the first and second transistors comprise thin film transistors;
the first transistor comprises a threshold voltage alterable from an initial threshold voltage value to a target threshold voltage value;
the second drain terminal and the first source terminal are coupled together at the output node;
the input node of the amplifier is coupled to the second gate terminal; and
the first gate terminal and the first source terminal are configured to be selectively coupled together.

20. The apparatus of claim 19, wherein:
the integrated circuit further comprises a display over the substrate.

21. The apparatus of claim 19, further comprising:
a current source for the amplifier, the current source comprising the first transistor;
wherein:
the first transistor is configured to serve as a load device for the amplifier; and
a current output of the current source is adjustable by altering the threshold voltage of the first transistor towards the target threshold voltage value.

22. The apparatus of claim 19, wherein:
the first drain terminal is coupled to a voltage source;
the second source terminal is coupled to a ground;
the threshold voltage of the first transistor is configured to remain altered after a stress voltage is applied to the first gate terminal;
the stress voltage comprises 10 volts to 20 volts;
the stress voltage is applied from 100 seconds to 200 seconds;
the initial threshold voltage value is of 1 volt to 3 volts; and
the target threshold voltage value is of 1 volt to 3 volts.

23. The apparatus of claim 19, wherein:
the amplifier further comprises:
an antifuse mechanism actuatable to selectively couple together the first gate and first source terminals;
and
an impedance of the antifuse mechanism is alterable from an initial high impedance value to a target low impedance value upon actuation of the antifuse mechanism.

24. The apparatus of claim 23, wherein:
the antifuse mechanism comprises:
first and second antifuse conductors; and
an antifuse reactive layer coupled between the first and second conductors;
the antifuse mechanism is actuatable via a current through the antifuse reactive layer;
the antifuse reactive layer comprises at least one of:
an oxide layer, a metal oxide layer, a tantalum oxide layer, or an amorphous silicon layer;
and
the first and second antifuse conductors comprise at least one of:
a metallic material, a tantalum material, an aluminum material, or a molybdenum material.

25. The apparatus of claim 19, wherein:
the substrate comprises transistors of only at least one of:
a single channel type; or
a single initial operating mode;
the single channel type comprises one of:
an n-channel type; or
a p-channel type;
and
the single initial operating mode comprises one of:
a depletion mode; or
an enhancement mode.

26. The apparatus of claim 19, wherein:
the first transistor comprises:
an initial operating mode before alteration of the threshold voltage; and
a target operating mode after alteration of the threshold voltage to the target threshold voltage value;
wherein:
the initial operating mode comprises one of a depletion mode or an enhancement mode; and
the target operating mode comprises another one of the depletion mode or the enhancement mode.

27. The apparatus of claim 26, wherein:
a channel of the first transistor comprises an n-type channel;
the initial operating mode of the first transistor comprises the enhancement mode; and
the target operating mode of the first transistor comprises the depletion mode.

28. The apparatus of claim 19, wherein:
the second transistor comprises:
- a channel type comprising one of an n-channel or a p-channel; and
- an operating mode comprising one of a depletion mode or an enhancement mode;

the first transistor comprises:
- the channel type of the second transistor; and
- an initial operating mode comprising the operating mode of the second transistor;

the channel type of the first and second transistors remains unchanged when the threshold voltage of the first transistor is altered; and the operating mode of the second transistor remains unchanged when the threshold voltage of the first transistor is altered.

* * * * *